COMBINED TELEVISION CHANNEL SWITCH

Filed July 13, 1959

INVENTORS
HERBERT MEYER
& VOLKMAR RECKSTADT
BY [signature]
PATENT AGENT 3,036,212

COMBINED TELEVISION CHANNEL SWITCH

Herbert Meyer, Worzeldorf, near Nurnberg, and Volkmar Reckstadt, Nurnberg, Germany, assignors to Nurnberger Schwachstrom-Bauelemente Fabrik Gesellschaft mit beschränkter Haftung, Nurnberg, Germany Filed July 13, 1959, Ser. No. 826,565
Claims priority, application Germany Aug. 18, 1958
10 Claims. (Cl. 250—20)

The present invention relates to a combined television channel switch for the entire range of very high frequecies (VHF) and ultra high frequencies (UHF).

Generally, separate switch units with separate circuits have been used for receiving very high frequencies and ultra high frequencies. In such cases, the UHF switch was mechanically connected with the VHF switch, whereas the electrical circuits of these two switches were, at least to some extent, independent of each other. In the case of reception of VHF transmissions, the whole UHF system was disconnected, while in the case of UHF reception only the VHF oscillator was disconnected and the intermediate frequency generated in the UHF system was amplified in the very high frequency switch.

In addition, experiments have been made to combine these switches electrically with one another. For example, the following combinations have been tried:

(*a*) The switch units for very high frequencies and for ultra high frequencies have been equipped with individual preamplifiers, but a common oscillator and a common mixer were provided for both frequency ranges.

(*b*) The switch units for very high and ultra high frequency signals are individually provided with preamplifiers and also include frequency converters corresponding to the individual frequency range.

(*c*) The switches for VHF and UHF reception are electrically combined and use the same signal path. In this case, a preamplifier of single radio frequency amplifying stage common to both ranges is used as well as a common local oscillator and a common mixer, which may be a crystal mixer. A crystal mixer requires an additional intermediate frequency amplifier stage, since it does not have the gain of an electron tube mixer.

In the above mentioned three examples, four tubes or a mixer crystal and three tubes are necessary.

It is an object of this invention to reduce this complexity and the attendant relatively high expense and also to simplify the circuit and the design of the combined switch.

In the past, when UHF and VHF switches and respective circuits were mentioned in text material, for comparison purposes for example, the UHF switch was always limited to the UHF range in its application.

With respect to the tuning of the receiver channels within the two frequency ranges for the television channel switches, capacitive tuning has been known in both the VHF and the UHF ranges, although separate tuning members for the two frequency ranges have been necessary due to the separation of the circuits. In another known tuning device for tuning the channel switch to the individual receiving channels, a discontinuous inductive tuning to fixed channel frequencies has been provided for the VHF switches, while continuous capacitive tuning was used for the UHF switches.

In view of the fact that there are so many different types of television channel switches, no one particular switch type can be considered as standard, except the turret-type tuner of the VHF range. Each of the combinations of VHF and UHF switches is unique due to the separation of the circuits for the two frequency ranges so that separate casings are usually provided for the tube system and for the tuning members. Therefore, the VHF and UHF units can be distinguished from one another at a glance. These separate casings are generally designed in such a manner that the two switch units can be readily mechanically combined and arranged with respect to each other to save space.

It is another object of the invention to provide a combined television channel switch for the VHF and UHF ranges, whereby the circuits of the two frequency ranges are combined in such a manner that a common casing may be used, whereby the new combined switch is superior to the known switch combinations with respect to space requirements and construction.

It is a further object of the invention to use all of the tube systems mentioned above, such as the preamplifier and self-oscillating mixer, or preamplifier, oscillator, and mixer in the same circuit arrangement and in the same manner for VHF and UHF, whereby, in case of a preamplifier and of separated oscillator and mixer systems, a mixer tube is provided in the mixer system rather than a mixer crystal.

It is a still further object of the invention to use a self-oscillating mixer tube common to the two frequency ranges in addition to a comomn preamplifier for the two VHF and UHF ranges.

It is a still further object of the invention to insert the preamplifier common to the two frequency ranges or the common self-oscillating mixer tube, or both, simultaneously in the grounded-grid circuit.

It is a further object of the invention to provide the VHF and UHF ranges inductively tunable, because then the same tuning means can be used for the inductive tuning in these ranges, and to employ as inductive tuning means for tuning the VHF bands and UHF range, slide variometers with tank circuit characteristics.

Still further objects and the entire scope of applicability of the present invention will become apparent from the detailed description given hereinafter; it should be understood, however, that the detailed description and specific examples, while indicating preferred embodiments of the invention, are given by way of illustration only, since various changes and modifications within the spirit and scope of the invention will become apparent to those skilled in the art from this detailed description.

Figures 1, 2, 3:
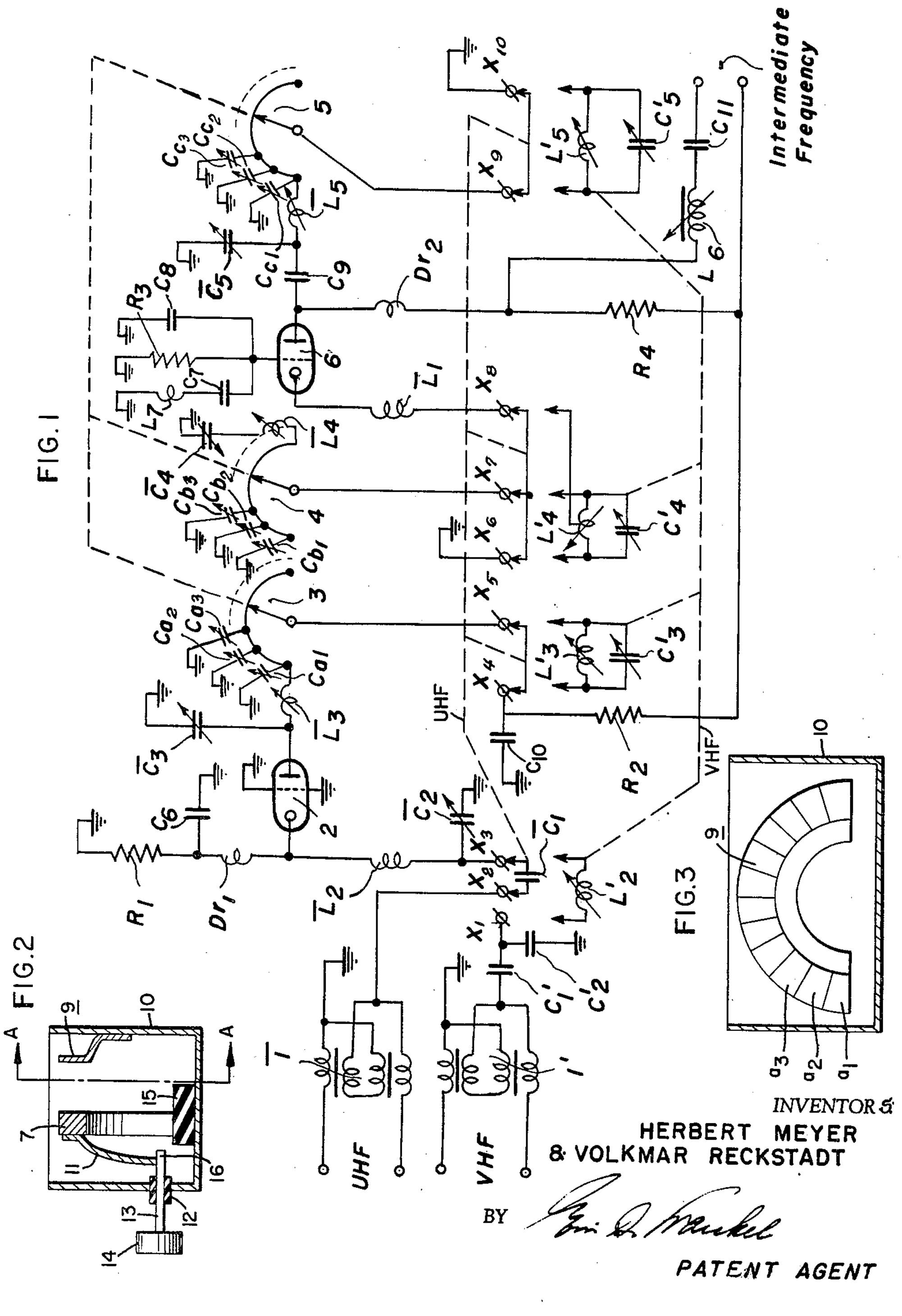
FIG. 1 is a schematic circuit diagram of the UHF and VHF tuning system of this invention.
FIG. 2 is a side view, partially in section, of an inductive tuning member used in the circuit of FIG. 1.
FIG. 3 is an elevational view, partially in section, of the inductive tuning member of FIG. 2 taken along line A—A.

In FIG. 1, a radio frequency amplifier or preamplifier tube 2 is connected to both the UHF and the VHF signal paths as an amplifier common to both. A triode 6 serving as a local oscillator-mixer stage also serves the two ranges of frequencies. The tubes 2 and 6 may be a PC 86 and a 6 BY4 plate triode or a pencil tube, respectively. In accordance with the principles of this invention, no further complement of tubes is required for the television radio frequency stages and switching units.

In FIG. 1 the reference characters which are primed, such as 1', $C_1'$, etc, are those parameters which are part of the VHF circuits, and the corresponding barred reference characters, such as $\bar{1}$, $\bar{C}_1$, are those parameters which form part of the UHF circuits and which are always operative. The elements used for VHF reception are connected into the circuits by the switch contacts $X_1$ to $X_{10}$, and are not used during UHF reception. The circuit elements used during UHF reception are small with respect to those required for VHF reception, and, as a result, they do not adversely affect the operation of the circuits under any conditions. Those components which are designated by reference characters, neither primed nor barred, are the components which are common to both UHF and VHF reception.

The reference character $\bar{1}$ designates a wide band ferrite core transformer for UHF reception, and the corresponding wide band ferrite core transformer for VHF reception is designated by the reference character 1′. These transformers serve both to transform the impedance of a balanced antenna system to that of the unbalanced input circuits and also to match the two impedances to provide suitable reception. This transformation may be necessary to match an antenna and transmission line of 240 ohms to an input impedance of 60 ohms. The outputs of the transformers are further matched to the input of the tube 2 by the $\pi$ network formed by the capacitors $\overline{C}_1$, $\overline{C}_2$, inductor $\overline{L}_2$ and the cathode-grid capacitance of the tube 2. In the reception of VHF signals, the inductor $\overline{L}_2$ has virtually no effect on the operation of the circuit, and the matching of the output of the transformer 1′ is performed by the $\pi$ network comprising capacitors $C_1'$, $C_2'$, inductor $L_2'$, the cathode-grid capacitance of tube 2 and capacitor $\overline{C}_2$.

Connecting the band-pass filter to the mixer stage 6 is an inductor $\overline{L}_1$ during UHF operation and a tapped inductor $L_4'$ during VHF operation.

The band-pass filter itself comprises, for UHF operation, a slide variometer 3 which is connected at one end to a variable inductor $\overline{L}_3$, the other end of which is connected to one end of a variable capacitor $\overline{C}_3$, and a second unit comprises a slide variometer 4 connected at one end to one end of a variable inductor $\overline{L}_4$, the other end of which is connected to one end of a variable capacitor $\overline{C}_4$.

The two slide variometers 3 and 4 each represent a continuously tunable quarter wave length tank circuit, as does an additional slide variometer 5 connected at one end to an inductor $\overline{L}_5$ which is connected across a variable capacitor $\overline{C}_5$ and through a capacitor $\overline{C}_9$ to the anode of the mixer stage 6 to form an oscillatory circuit therewith. The slides of the variometers 3 and 4 are ganged, and are also usually mechanically connected to that of variometer 5. To ensure proper tracking, a two point alignment of the variometers for UHF operation may be obtained by the adjustment of the variable inductors $\overline{L}_3$, $\overline{L}_4$, and $\overline{L}_5$ and the capacitors $\overline{C}_3$, $\overline{C}_4$, and $\overline{C}_5$ so that when the variometers are in their fully rotated positions, adjustment of the inductors modifies the upper range of the system and with the slides turned in the opposite direction, the capacitors may be used to modify the lower range of the system. The variometers 3, 4, and 5 are each continuously variable inductive components.

The movable arms of the variometers 3, 4 and 5 are connected to switch contacts $X_5$, $X_7$ and $X_9$ respectively. These contacts are grounded for high frequency energy by the bridging connections in the UHF operating positions. When the circuits are switched to VHF operation, the grounding bridge connections are disconnected and the members $L_3'$—$C_3'$; $L_4'$—$C_4'$; and $L_5'$—$C_5'$ replace them. Accordingly, these components are variable and permit a two-point alignment of the slide variometers in the same manner as in UHF operation. The variable components for the alignment of the variometers in the UHF range ($\overline{L}_3$, $\overline{C}_3$), ($\overline{L}_4$, $\overline{C}_4$), ($\overline{L}_5$, $\overline{C}_5$) which are permanently connected in the circuit are ineffective, when the adjusting components ($L_3'$, $C_3'$), ($L_4'$, $C_4'$), ($L_5'$, $C_5'$) are connected, in case of VHF operation, because of the dimensions of these components. Therefore, these components may also remain connected in the circuit.

The tube 2 and the oscillating-mixing tube 6 common for both UHF and VHF operation are connected as grounded-grid stages. The intermediate frequency neutralization of the oscillating-mixing tube 6 takes place substantially in the series circuit comprising an inductor $L_7$ and a capacitor $C_7$. The cathode resistor of the first tube 2 is $R_1$; $R_3$ is the grid-leak resistor for the tube 6; $C_6$ serves as a cathode by-pass capacitor for tube 2; the grid of tube 6 is connected to ground by capacitor $C_8$, and choke $Dr_1$ serves as an RF blocking choke for both VHF and UHF signals in the cathode circuit of the tube 2. The oscillator circuit comprising the slide variometer 5, the variable inductor $\overline{L}_5$ and the variable capacitor $\overline{C}_5$ is coupled to the mixer tube 6 via a capacitor $C_9$. A variable inductor $L_6$ and a capacitor $C_{11}$ form an intermediate frequency coupling circuit. Resistors $R_2$ and $R_4$ are anode filter resistors, while $C_{10}$ is a grounded band filter capacitor.

Referring to FIGURES 2 and 3 in detail, the slide variometers 3, 4 and 5 each comprises a housing 10 which may be of electrically conductive material. An insulating block 15 supports a fixed, curved, conductive member 7, against which a movable slide contact 11 bears. The movable slide contact 11 is rotatably supported on a shaft 16 which is supported for rotation by an insulating bushing 12 in an opening in the wall of the housing 10. The shaft 13 and the slide contact 11 are manually movable by means of a knob 14 fastened to the shaft 13 externally of the housing 10. Attached to another wall of the housing 10 and arranged in a plane parallel to the plane of the curved conductive member 7 is a fan-shaped conductor 9.

This fan-shaped conductor 9 is arranged in parallel with the conductive member 7 to establish capacitive relationships between the two members. The capacitors $Ca_1$, $Ca_2$, etc. $Cb_1$, $Cb_2$, etc. are connected to the curved conductive members 7 of the respective variometers 3, 4 and 5, and are connected into the circuit to effect tuning thereof by movement of the slide contact or wiper 11. The individual portions $a_1$, $a_2$, $a_3$, etc. of the fan-shaped member 9 may be physically displaced, as by bending, either towards or away from the conductive member 7 to afford compensation in capacitance for the circuits and, thus, ensure linear tuning.

The tuning for the VHF and UHF is obtained by means of the same tuning components, the slide variometers 3, 4 and 5. However, the individual channels of the VHF and UHF ranges are not precisely adjusted in the same manner. While the two bands of UHF range can be covered by simply turning the slide variometers without switching, switching means are provided between the bands for the VHF range in order to skip over frequencies between the two television bands. Short-circuiting bridges are provided in the UHF switching position, as mentioned in the foregoing, between the switch terminals $X_4$ and $X_5$, $X_6$ and $X_7$, $X_9$ and $X_{10}$, respectively, while in the two VHF switch positions corresponding to the bands I and III of the VHF range, adjusting components ($L_3'$—$C_3'$), ($L_4'$—$C_4'$) and ($L_5'$—$C_5'$), respectively, corresponding to the bands, are inserted between the same switching points. Thus, three switch positions are provided, two for VHF and one for UHF operation.

Therefore, the separate bands of the VHF range and the combined bands of the UHF range are adjusted discontinuously by switching the respective fixed components, while within the VHF bands and the UHF range, the adjustment takes place continuously by the same inductive tuning means, the slide variometers 3, 4 and 5.

The adjusting components or short-circuiting bridges which are different for the different bands may be ganged by means of a switching member, such as a wave switch or a drum. Suitably, push buttons or slidable switches may be used for switching the respective ranges.

In a further development of the invention, the slide variometers are each equipped with two slides connected to separate switch terminals, so that in FIGURE 1 additional switch terminals $X_5'$, $X_7'$, $X_9'$ would have to be provided in addition to the switch terminals $X_5$, $X_7$, $X_9$. As a result of this, a duplex operation will be possible, i.e., the combined telvision channel switch according to the invention will enable separate and independent tuning for VHF and UHF. If the circuit diagram of FIGURE 1 is modified in this way with respect to the short-circuiting bridge in case of UHF operation for a duplex circuit system, the switch contacts $X_5'$, $X_7'$, $X_9'$ remain open; in the VHF switch position, the switch contacts $X_5$, $X_7$ and $X_9$ remain open, while the contacts $X_5'$, $X_7'$, $X_9'$ corresponding thereto, which are connected to the second slide of the variometer, are connected to the associated contacts of the adjusting components ($L_3'$—$C_3'$), ($L_4'$—$C_4'$), ($L_5'$—$C_5'$) respectively. The function of the switch contacts $X_4$, $X_6$, $X_8$ and $X_{10}$ remains unchanged in case of change-over to the duplex operation.

Simultaneously, with the switching over of the adjusting components or short-circuiting bridges from VHF to UHF and vice versa, a switching takes place on the terminals $X_1$, $X_2$, and $X_3$ in such a manner, that in the VHF bands, the inductor $L_2'$ is inserted between the contacts $X_1$ and $X_3$ while the contact $X_2$ remains open, and in the UHF switch position, the capacitor $C_1$ is inserted between the contacts $X_2$ and $X_3$, while the contact $X_1$ remains open.

What is claimed is:

1. For use in a television receiver, a channel switching arrangement comprising, in combination: an RF amplifier incorporating a single grounded-grid electron tube and usable in UHF and VHF ranges; a self-oscillating mixer incorporating a single grounded-grid electron tube, said mixer likewise being usable in UHF and VHF ranges; band-pass filter means interconnecting said amplifier and said mixer and incorporating two continually tunable inductances formed as slide variometers having distributed compensatable partial capacitances; a third continually tunable inductance formed as a slide variometer having distributed compensatable partial capacitances, said third inductance being connected to said mixer; and switching means in circuit with said amplifier, said mixer, said filter means, and said third inductance for selectively connecting the receiver for operation in UHF range and for operation in at least one VHF range, whereby said tunable inductances may be used for tuning the receiver within the particular range in which the receiver is operating.

2. A channel switching arrangement as defined in claim 1, wherein said band-pass filter means comprise second switching means for introducing additional components necessary to provide adequate tuning for said VHF range.

3. A channel switching arrangement as defined in claim 2, further comprising means for ganging said variometers for simultaneous operation.

4. A channel switching arrangement as defined in claim 3, further comprising variable inductive and capacitive means connected to said variometers for providing a means for adjusting the relative variations in said variometers for proper tracking.

5. A channel switching arrangement as defined in claim 4, further comprising independent means associated with said variometers for adjusting the frequency response thereof to provide uniform tracking between the respective variometers.

6. A channel switching arrangement as defined in claim 1, wherein said switching means selectively connect the receiver for operation in UHF range and for operation in a plurality of VHF ranges.

7. A channel switching arrangement as defined in claim 1 wherein said tunable inductances each comprise two independent adjusting means connectable, respectively, to UHF and VHF components of the receiver, whereby the UHF and VHF ranges are continually tunable independently of each other.

8. A channel switching arrangement as defined in claim 1 wherein said third inductance is tunable independently of the remainder of said inductances.

9. A channel switching arrangement as defined in claim 1 wherein said switching means comprise push-button means.

10. A channel switching arrangement as defined in claim 1 wherein said switching means comprise a drum-type switch mechanism.

References Cited in the file of this patent

UNITED STATES PATENTS

| | | |
|---|---|---|
| 2,107,393 | Schlessinger | Feb. 8, 1938 |
| 2,734,175 | Wasmansdorff | Feb. 7, 1956 |
| 2,789,212 | Achenbach et al. | Apr. 16, 1957 |
| 2,802,066 | Wohl | Aug. 6, 1957 |
| 2,812,433 | Stolk | Nov. 5, 1957 |
| 2,880,282 | Carlson | Mar. 31, 1959 |
| 2,898,563 | DeCola et al. | Aug. 4, 1959 |